United States Patent
Bischoff et al.

(10) Patent No.: US 10,269,662 B2
(45) Date of Patent: Apr. 23, 2019

(54) SCANNING METHODS FOR FOCUS CONTROL FOR LITHOGRAPHIC PROCESSING OF RECONSTITUTED WAFERS

(71) Applicant: Ultratech, Inc., San Jose, CA (US)

(72) Inventors: Paul M. Bischoff, Livermore, CA (US); Emily M. True, San Ramon, CA (US); Raymond Ellis, Aptos, CA (US); A. J. Crespin, San Jose, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 15/834,614

(22) Filed: Dec. 7, 2017

(65) Prior Publication Data

US 2018/0166348 A1    Jun. 14, 2018

Related U.S. Application Data

(60) Provisional application No. 62/431,683, filed on Dec. 8, 2016.

(51) Int. Cl.
*H01L 21/66*    (2006.01)
*H01L 23/00*    (2006.01)
(Continued)

(52) U.S. Cl.
CPC .............. *H01L 22/20* (2013.01); *G03F 1/36* (2013.01); *G03F 7/20* (2013.01); *G03F 9/7034* (2013.01); *G03F 9/7046* (2013.01); *H01L 21/0274* (2013.01); *H01L 21/67259* (2013.01); *H01L 21/681* (2013.01); *H01L 23/00* (2013.01); *H01L 24/02* (2013.01); *H01L 24/96* (2013.01); *H01L 24/05* (2013.01); *H01L 24/13* (2013.01); *H01L 2224/0231* (2013.01); *H01L 2224/0401* (2013.01); *H01L 2224/12105* (2013.01); *H01L 2224/13024* (2013.01); *H01L 2224/13025* (2013.01)

(58) Field of Classification Search
CPC ............................... H01L 24/13; H01L 24/96
See application file for complete search history.

(56) References Cited

U.S. PATENT DOCUMENTS

3,435,744 A    4/1969 Stimson
3,813,679 A    5/1974 Hasegawa et al.
(Continued)

*Primary Examiner* — Caridad Everhart
*Assistant Examiner* — Ankush Singal
(74) *Attorney, Agent, or Firm* — Downs Rachlin Martin PLLC (57) ABSTRACT

A method of processing a reconstituted wafer that supports IC chips includes operably disposing the reconstituted wafer in a lithography tool that has a depth of focus and a focus plane and that defines exposure fields on the reconstituted wafer, wherein each exposure field includes at least one of the IC chips. The method also includes scanning the reconstituted wafer with a line scanner to measure a surface topography of the reconstituted wafer as defined by the IC chips. The method also includes, for each exposure field: i) adjusting a position and/or an orientation of the reconstituted wafer so that a photoresist layers of the IC chips within the given exposure field fall within the depth of focus; and ii) performing an exposure with the lithography tool to pattern the photoresist layers of the IC chips in the given exposure field.

10 Claims, 11 Drawing Sheets

(51) Int. Cl.
*H01L 21/67* (2006.01)
*H01L 21/68* (2006.01)
*G03F 7/20* (2006.01)
*G03F 1/36* (2012.01)
*H01L 21/027* (2006.01)
*G03F 9/00* (2006.01)

(56) References Cited

U.S. PATENT DOCUMENTS

| | | |
|---|---|---|
| 4,255,029 A | 3/1981 | Freudenschuss |
| 4,363,961 A | 12/1982 | Okada et al. |
| 4,363,962 A | 12/1982 | Shida |
| 4,395,117 A | 4/1983 | Suzuki |
| 4,506,977 A | 3/1985 | Sato et al. |
| 4,595,829 A | 6/1986 | Neumann et al. |
| 4,639,587 A | 1/1987 | Chadwick et al. |
| 4,654,338 A | 2/1987 | Juliana, Jr. et al. |
| 4,650,983 A | 3/1987 | Suwa |
| 4,705,940 A | 11/1987 | Kohno |
| 4,725,722 A | 2/1988 | Maeda et al. |
| 4,890,239 A | 12/1989 | Ausschnitt et al. |
| 4,945,220 A | 7/1990 | Mallory et al. |
| 4,952,970 A | 8/1990 | Suzuki et al. |
| 5,008,705 A | 4/1991 | Sindledecker |
| 5,216,235 A | 6/1993 | Lin |
| 5,306,902 A | 4/1994 | Goodman |
| 5,337,084 A | 8/1994 | Nakamura |
| 5,361,122 A | 11/1994 | Kataoka et al. |
| 5,489,966 A | 2/1996 | Kawashima et al. |
| 5,619,032 A | 4/1997 | Kasdan |
| 5,675,140 A | 10/1997 | Kim |
| 5,825,043 A | 10/1998 | Suwa |
| 5,825,468 A | 10/1998 | Ishimaru |
| 5,825,469 A | 10/1998 | Nam et al. |
| 5,883,703 A | 3/1999 | Knirck et al. |
| 5,883,704 A | 3/1999 | Nishi et al. |
| 5,960,107 A | 9/1999 | Leroux |
| 6,057,908 A | 5/2000 | Ota |
| 6,118,515 A | 9/2000 | Wakamoto et al. |
| 6,165,057 A * | 12/2000 | Gill, Jr. .......... B24B 37/005 451/287 |
| 6,190,810 B1 | 2/2001 | Lai et al. |
| 6,246,053 B1 | 6/2001 | Kendall et al. |
| H1972 H | 7/2001 | Inoue |
| 6,501,532 B2 | 12/2002 | Suzuki |
| 6,847,919 B2 | 1/2005 | Zhang et al. |
| 6,878,916 B2 | 4/2005 | Schuster |
| 6,885,429 B2 | 4/2005 | Lyons et al. |
| 6,968,288 B2 | 11/2005 | Macaluso et al. |
| 6,975,407 B1 | 12/2005 | Wang et al. |
| 6,979,833 B2 | 12/2005 | Lyons |
| 6,984,836 B2 | 1/2006 | Lyons |
| 7,136,149 B2 | 11/2006 | Mickan et al. |
| 7,142,315 B2 | 11/2006 | Lange et al. |
| 7,239,371 B2 | 7/2007 | Liegl et al. |
| 7,248,336 B2 | 7/2007 | Nelson et al. |
| 7,301,604 B2 | 11/2007 | Lin et al. |
| 7,336,341 B2 | 2/2008 | Mimotogi et al. |
| 7,342,641 B2 | 3/2008 | Sogard |
| 7,369,214 B2 | 5/2008 | Galburt |
| 7,379,159 B2 | 5/2008 | Baselmans et al. |
| 7,642,019 B2 | 1/2010 | Kim |
| 7,656,512 B2 | 2/2010 | Mieher et al. |
| 7,746,484 B2 | 6/2010 | Van De Vin et al. |
| 7,749,666 B2 | 7/2010 | Gassner et al. |
| 7,982,884 B2 | 7/2011 | Smith |
| 8,227,180 B2 | 7/2012 | Brunner et al. |
| 8,418,088 B2 | 4/2013 | Ye et al. |
| 8,760,626 B2 | 6/2014 | Li et al. |
| 8,772,054 B2 | 7/2014 | Wang et al. |
| 8,792,080 B2 | 7/2014 | Sapp et al. |
| 2002/0136992 A1 * | 9/2002 | Ho .......... G03F 7/70333 430/397 |
| 2006/0160037 A1 | 7/2006 | Brodsky et al. |
| 2008/0131796 A1 | 6/2008 | Werner et al. |
| 2009/0190108 A1 | 7/2009 | Ema et al. |
| 2009/0262320 A1 | 10/2009 | Staals et al. |
| 2011/0134308 A1 | 6/2011 | Arnz et al. |
| 2014/0036245 A1 | 2/2014 | Sogard |

* cited by examiner

SCANNING METHODS FOR FOCUS CONTROL FOR LITHOGRAPHIC PROCESSING OF RECONSTITUTED WAFERS

RELATED APPLICATION DATA

This application claims the benefit of priority of U.S. Provisional Patent Application Ser. No. 62/431,683, filed on Dec. 8, 2016, and titled "Scanning Methods For Focus Control For Lithographic Processing Of Reconstituted Wafers," which is incorporated by reference herein in its entirety.

FIELD OF THE INVENTION

The present disclosure relates to lithographic processing of reconstituted wafers, and in particular to scanning methods for focus control for lithographic processing of reconstituted wafers.

BACKGROUND

The manufacturing of semiconductor devices such as integrated circuit (IC) chips utilizes semiconductor wafers. The semiconductor wafers serve as a substrate in which various three-dimension IC structures are formed using a series of processing steps. Once the IC chips are formed, they then need to be packaged, i.e., encapsulated in a support structure to form the finalized IC device.

One approach to the packaging process involves the use of reconstituted wafers. The size of the reconstituted wafer can be similar to a 300 mm silicon wafer, or it may be any reasonable size and shape. The reconstituted wafer is made of a resin. The resin is poured into a mold. While the resin is solidifying, known good IC chips (dice) are embedded in the surface of the resin in select positions. The resin is then allowed to solidify, thereby securing the IC chips in their select positions.

After the reconstituted wafer is fabricated, a lithographic process is carried out to electrically connect select IC chips. The lithographic process involves forming line features that can have widths in the range from 1 micron to 10 microns using a lithographic tool that has an exposure field and a depth of focus over the exposure field in the range from 1 micron to 20 microns.

Ideally, each IC chip is placed in a select (x,y) coordinate location with its surface at a select height h in the z direction and residing in the corresponding z-plane. One or more IC chips may fall within the exposure field. In some cases, one or more IC chips are used to define a module, with one or more modules falling within a given exposure field. The lithographic tool moves relative to the reconstituted wafer in a step-and-repeat manner or a step-and-scan manner to process all of the modules supported by the reconstituted wafer.

Under ideal conditions, the lithographic process can be readily carried out without much concern about whether the surfaces of the IC chips within a given exposure field fall within the depth of focus of the lithography tool. Unfortunately, there is usually substantial error in the positions of the IC chips relative to their ideal positions. For example, as an IC chip is placed in the resin, it can move slightly, e.g., can tilt up or down and can rotate. The IC chip may also sink into the resin or not sink far enough into the resin so that the heights of the IC chips are not all the same and not in the same z plane. The curing of the resin results in some amount of shrinkage that can result in movement of the IC chips. As a result, the surface of the IC chips within a given exposure field do not all reside in a common plane.

SUMMARY OF THE DISCLOSURE

An aspect of the disclosure is a method of processing a reconstituted wafer that supports IC chips that includes operably disposing the reconstituted wafer in a lithography tool that has a depth of focus and a focus plane and that defines exposure fields on the reconstituted wafer, wherein each exposure field includes at least one of the IC chips. The method also includes performing at least one scan of the reconstituted wafer with a line scanner having a plurality of height sensor elements to measure a surface topography of the reconstituted wafer, wherein the surface topography is defined by the plurality of IC chips. The method also includes, for a given exposure field: i) adjusting at least one of a position and an orientation of the reconstituted wafer relative to the focus plane of a lithography tool so that the photoresist layers of the IC chips within the given exposure field fall within the depth of focus; and ii) performing an exposure with the lithography tool to pattern the photoresist layers of the IC chips in the given exposure field. The acts i) and ii) can be repeated for each exposure field to process the entire reconstituted wafer.

Another aspect of the disclosure is a method of processing a reconstituted wafer that supports IC chips each having an upper surface coated with a photoresist layer. The method includes a) operably disposing the reconstituted wafer in a lithography tool that has a depth of focus and a focus plane and that defines exposure fields on the reconstituted wafer, wherein each exposure field includes at least one of the IC chips. The method also includes b) performing at least one scan of the reconstituted wafer with a line scanner that comprises a plurality of height sensor elements arranged along a long direction to measure a surface topography of the reconstituted wafer, wherein the surface topography is defined by the plurality of IC chips. The method also includes c) for a given exposure field: i) adjusting at least one of a position and an orientation of the reconstituted wafer relative to the focus plane of a lithography tool so that the photoresist layers of the IC chips within the given exposure field fall within the depth of focus; and ii) performing an exposure with the lithography tool to pattern the photoresist layers of the IC chips in the given exposure field. The method also includes d) repeating act c) for each of the exposure fields.

Another aspect of the disclosure is the method as described above, the method further includes e) processing the patterned photoresist layers of the IC chips to form respective conductive structures on the upper surfaces of the IC chips after act d).

Another aspect of the disclosure is the method as described above, wherein the height sensor elements each have a width W and a center-to-center spacing of S, wherein S>W. The method further includes performing a first scan of the upper surface of reconstituted wafer, then defining a shifted position of the line scanner by shifting the line scanner in the long direction relative to the reconstituted wafer by an amount equal to or greater than the width W of the height sensor elements, and then performing a second scan of the upper surface of reconstituted wafer with the line scanner in the shifted position in act b).

Another aspect of the disclosure is the method as described above, wherein the act b) of performing at least one scan of the reconstituted wafer includes moving both the line scanner and the reconstituted wafer.

Another aspect of the disclosure is the method as described above, the method further includes processing the patterned photoresist layers to form respective redistribution layers that each includes conductive features.

Another aspect of the disclosure is the method as described above, wherein the height sensor elements each have a width and a center-to-center spacing. The method further includes performing a first scan with a first center-to-center spacing, changing the center-to-center spacing to define a second center-to-center spacing, and performing a second scan with the second center-to-center spacing.

Another aspect of the disclosure is the method as described above, wherein the height sensor elements are mechanically connected to a mechanical linkage, and wherein changing the center-to-center spacing includes activating the mechanical linkage.

Another aspect of the disclosure is the method as described above, wherein the exposure fields have a field pitch in a cross-scan direction, the height sensor elements each have a width W and a center-to-center sensor spacing of S, wherein S>W, and wherein S is an integer fraction of the field pitch pF.

Another aspect of the disclosure is the method as described above, wherein act b) includes making at least 3 and no greater than 1000 height measurements per exposure field.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

Cartesian coordinates are shown in some of the Figures for the sake of reference and are not intended to be limiting as to direction or orientation.

In the discussion below, the term "orientation" can include a rotation about at least one of the x, y and z axes and the term "position" can include a translation in at least one of the x, y and z directions. Thus, an adjustment of at least one of a position and an orientation includes a movement in at least one of the six degrees of freedom, and can include movement in up to all six degrees of freedom normally associated with movement of an object in three dimensions.

Lithography Tool and Process

Figure 1:
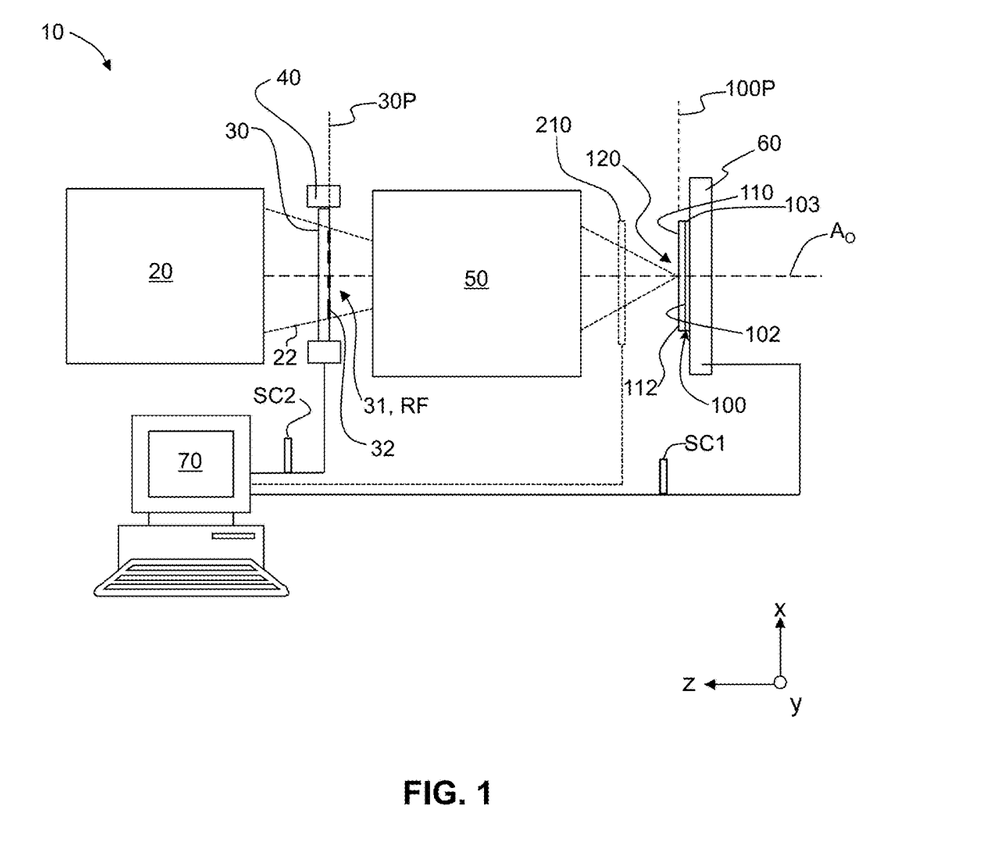
FIG. 1 is a schematic diagram of an example lithography tool used to carry out the methods described herein.

FIG. 1 is a schematic diagram of an example lithography system ("lithography tool") 10 used to carry out the methods disclosed herein. Example lithography tools are described in U.S. Pat. Nos. 7,177,099; 7,148,953; 7,116,496; 6,863,403; 6,813,098; 6,381,077; and 5,410,434, which patents are incorporated by reference herein in their entirety.

The lithography tool 10 includes, in order along an optical axis $A_O$, an illuminator 20, a reticle 30 (e.g., a patterned mask) supported by a reticle stage 40 at a reticle plane 30P, a projection lens 50, and a wafer 100 supported by a wafer stage 60 at a wafer plane 100P. Reticle 30 includes a patterned region 31 that includes pattern elements 32 and that defines a reticle field RF. Wafer 100 includes an upper surface 102 and an outer edge 103 and has a diameter WD (see FIG. 2).

Lithography tool 10 also includes a line scanner 210 that can be inserted to reside adjacent upper surface 102 of wafer 100. Line scanner 210 is part of a line-scanning height measurement system that can be incorporated into lithography tool 10 or operably arranged relative thereto, as is described in greater detail below.

A photosensitive layer 110, e.g., photoresist (hereinafter, "photoresist layer") with a top surface 112 is deposited on upper surface 102 of wafer 100. Photoresist layer 110 is activated by light (i.e., "actinic light") 22 generated by illuminator 20. In an example, actinic light 22 includes an ultraviolet wavelength and in a more specific example includes one of a g-line wavelength, an h-line wavelength, an i-line wavelength, a 248 nm wavelength and a 193 nm wavelength.

Lithography tool 10 also includes a controller 70 operably connected to reticle stage 40 and wafer stage 60. Controller 70 is configured to control the operation of lithography tool 10. An example controller 70 includes a computer such as a personal computer or workstation. In an example, controller 70 includes apparatus-control software that includes instructions, embodied in a non-transitory computer-readable medium, that control the various components of lithography tool 10.

Actinic light 22 from illuminator 20 illuminates at least a portion of the reticle field RF so that projection lens 50 forms a corresponding exposure field 120 at wafer 100 where an image of the reticle pattern is formed. Projection lens 50 defines a depth of focus over which images of reticle 30 are properly formed within photoresist layer 110 when forming exposure fields 120. The proper formation of patterns in photoresist layer 110 is required to achieve the highest yield for the lithography process.

Wafer stage 60 is movable (e.g., via a first control signal SC1 from controller 70) to form exposure fields 120 at different locations on wafer 100. In an example, reticle stage 40 can move with wafer stage 60 via a second control signal SC2 from controller 70. It is noted that wafer stage 60 can move in the z-direction.

The illuminated portion of the reticle field RF is thus imaged onto photoresist layer 110 of wafer 100 via projection lens 50. In an example embodiment, reticle 30 and wafer 100 are moved together in a manner that forms a scanned exposure field 120. This process is then repeated for a different (unexposed) region of wafer 100. This lithographic exposure approach is referred to in the art as "step and scan."

In another example, actinic light 22 illuminates the entire reticle field RF at once, thereby forming, in a single exposure, one exposure field 120. Wafer 100 is then moved, and the single static exposure is repeated. This printing approach is called "step and repeat."

After all exposure fields 120 are formed, wafer 100 is then removed from lithographic tool 10 (e.g., using a wafer handling system, not shown). Wafer 100 is then processed (e.g., developed, baked, etched, etc.) to transfer the patterns formed in photoresist layer 110 in each exposure field 120 to the underlying structures supported by the wafer. In methods disclosed herein, wafer 100 is a reconstituted wafer and the underlying structures are IC chips, as discussed below.

Once the patterns are transferred, the lithographic process can be repeated with different reticles 30. The result is the formation on the underlying structures of select semiconductor features, such as conductive wiring, contact pads, etc. In reconstituted wafers, such features are used in the packing process to form semiconductor devices that include one or more electrically interconnected IC chips.

Reconstituted Wafer

Figure 2:
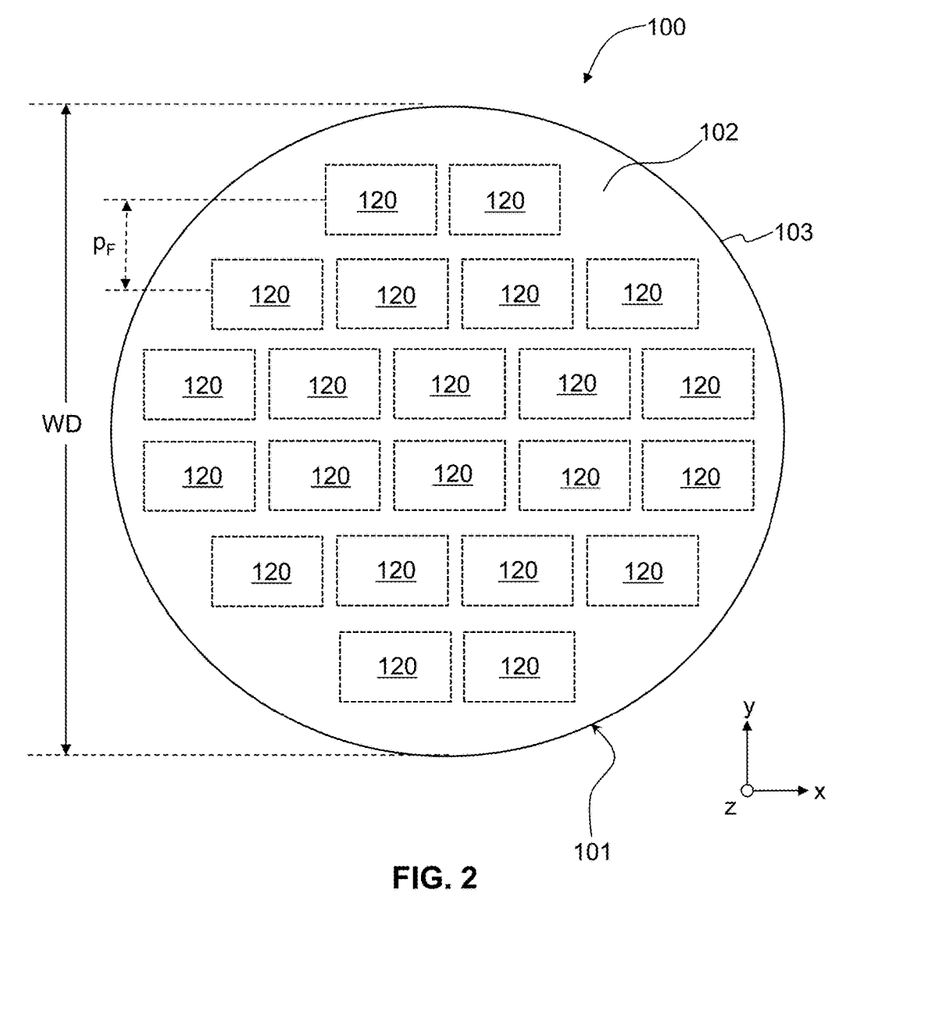
FIG. 2 is a top-down view of an example reconstituted wafer.

FIG. 2 is a top-down view of an example reconstituted wafer 100. Reconstituted wafer 100 has a body 101, an upper surface 102 and an outer edge 103. Reconstituted wafer 100 has a diameter WD. Reconstituted wafer 100 is shown with a number of exposure fields 120 formed thereon as described above using lithography tool 10.

Figure 3A:
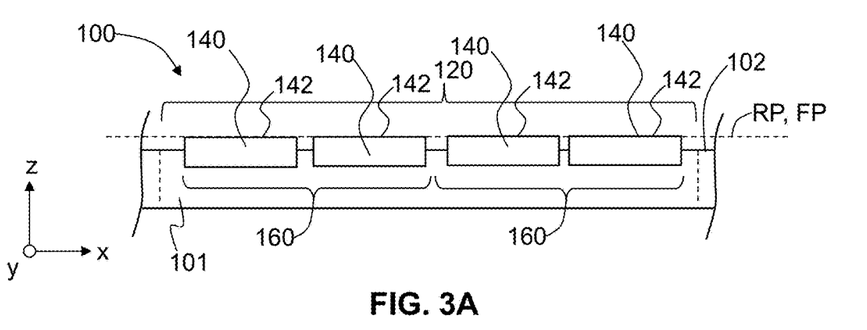
FIG. 3A is a x-z cross-sectional view of an example reconstituted wafer taken at one of the exposure fields and shows an ideal case where the top surfaces of the IC chips all reside in the same plane.
Figure 3B:
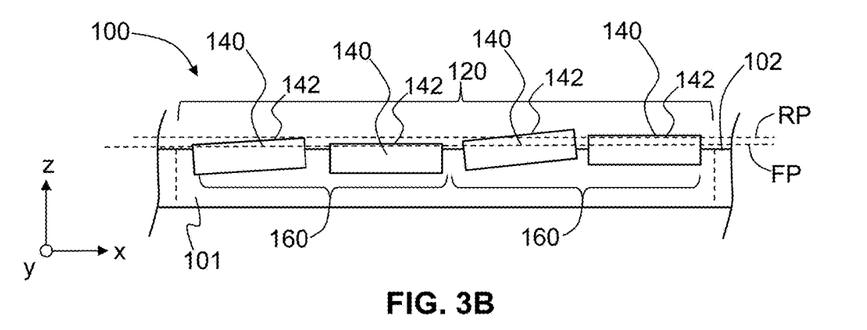
FIG. 3B is similar to FIG. 3A and shows an example reconstituted wafer where the upper surfaces of the IC chips do not all reside in the same plane.

FIGS. 3A and 3B are close-up x-z cross-sectional view of reconstituted wafer 100 taken at one of exposure fields 120. Each exposure field 120 includes at least one IC chip 140, and four IC chips 140 are shown in the example exposure field 120 by of illustration. The IC chips 140 each have an upper surface 142. In an example, each exposure field 120 includes one or more modules 160, with each module 160 include at least one IC chip 140. Two modules 160 are shown in FIGS. 3A and 3B by way of example. IC chips 140 are shown in FIG. 3A as having ideal positioning within body 101 of reconstituted wafer 100, wherein upper surfaces 142 of the IC chips all reside in a reference plane RP. In contrast, IC chips 140 are shown in FIG. 3B as having non-ideal positioning within body 101 of reconstituted wafer 100 so that upper surfaces 142 of IC chips 140 do not all reside in reference plane RP.

Figure 3C:
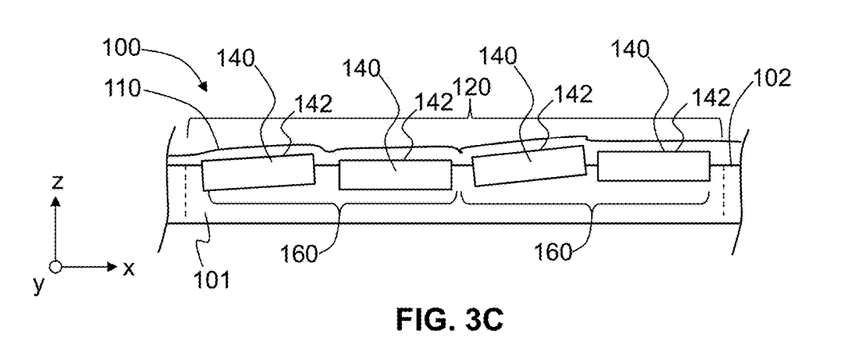
FIG. 3C is similar to FIG. 3B and shows an example where the IC chips are coated with a photoresist layer as part of the photolithographic process for forming electrical interconnections between the IC chips as part of the packing process.

FIG. 3C is similar to FIG. 3B and shows photoresist layer 110 covering IC chips 140 and upper surface 102 of reconstituted wafer 100. The reference plane RP and focus plane FP are omitted for ease of illustration. As explained above, photoresist layer 110 is selectively exposed at the location of IC chips 140 to form a pattern in photoresist layer 110. Exposed photoresist layer 110 is then processed (e.g., developed, etched, etc.) using known photolithographic techniques so that the initial pattern is transferred to IC chips 140 and ultimately converted to electrically conductive features (e.g., wires, contact pads, etc.). In an example, the electrically conductive features define a redistribution layer.

Figure 4A:
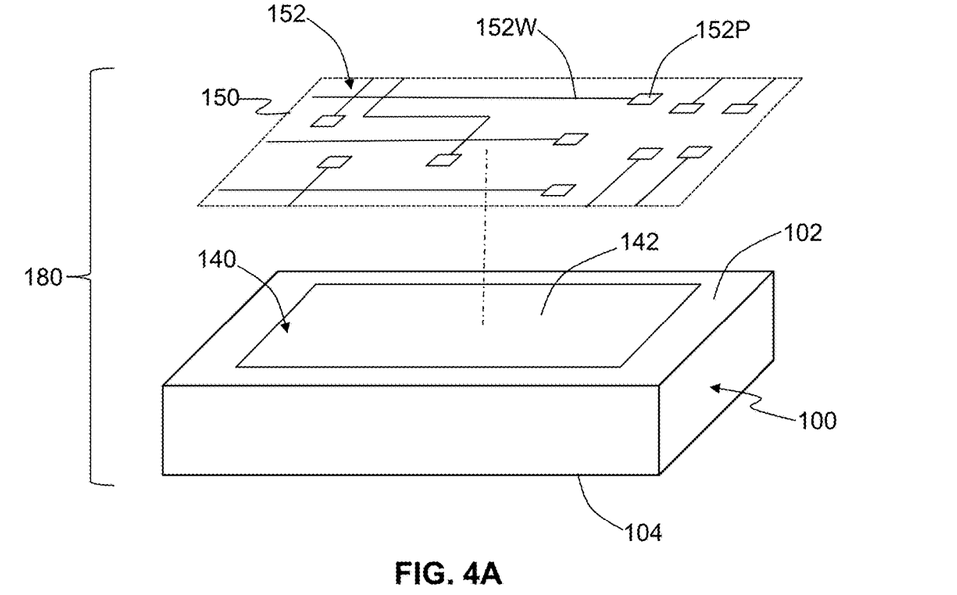
FIG. 4A an elevated and partially exploded view of a portion of an IC chip assembly that shows a redistribution layer formed on top of the upper surface of the reconstituted wafer and the upper surface of the IC chip.

FIG. 4A is an elevated and partially exploded view of a portion of an IC chip assembly 180 formed from reconstituted wafer 100. IC chip assembly 180 includes an example redistribution layer 150 formed on upper surface 102 of reconstituted wafer 100 and upper surface 142 of IC chip 140. Redistribution layer 150 includes electrically conductive features 152, such as conductive lines (wires) 152W and contact pads 152P.

Figure 4B:
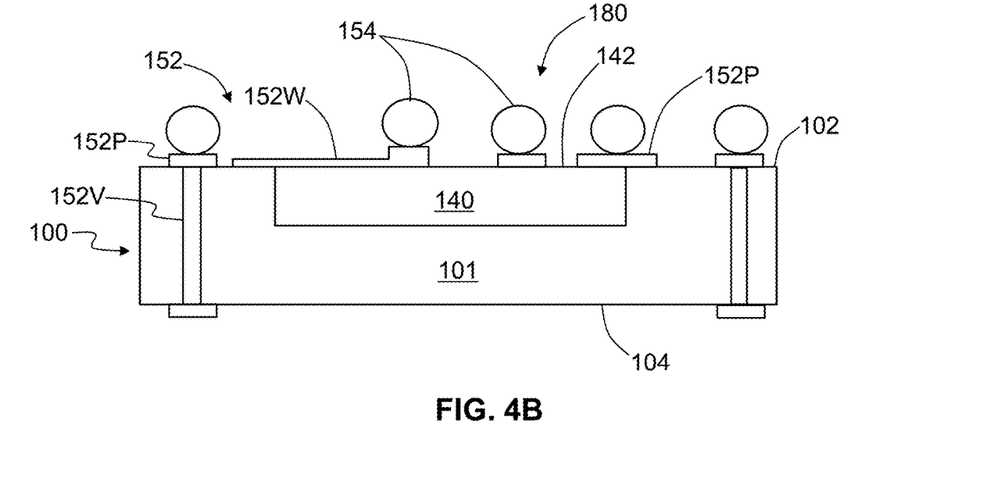
FIG. 4B is a cross-sectional view of the IC chip assembly according to FIG. 4A and shows solder balls disposed on the conductive pads of the redistribution layer.

FIG. 4B is a cross-sectional view of an IC chip assembly 180 that includes reconstituted wafer 100 of FIG. 4A and redistribution layer 150. IC chip assembly 180 further includes solder balls 154 disposed on the contact pads 152P of redistribution layer 150. Also shown in FIG. 4B are conductive vias 152V that pass through body 101 of reconstituted wafer 100 between upper surface 102 and lower surface 104 and that are in contact with the contact pads 152P on either surface 102, 104. In an example, conductive lines 152W and contact pads 152P are formed in different layers using separate photolithographic processes. More generally, redistribution layer 150 can comprise multiple sub-layers each having its own configuration and type of conductive features 152.

Figure 5A:
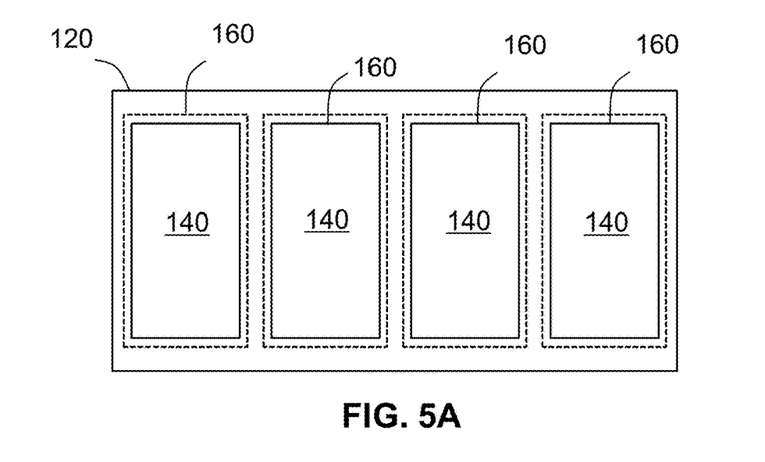
FIGS. 5A through 5C are top-down views of an example exposure field that shows different arrangements of the IC chips therein and showing example modules within each of the exposure fields.
Figure 5B:
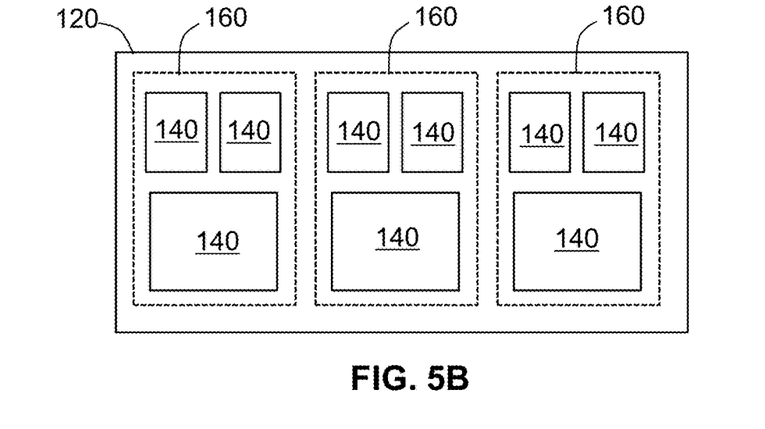
Figure 5C:
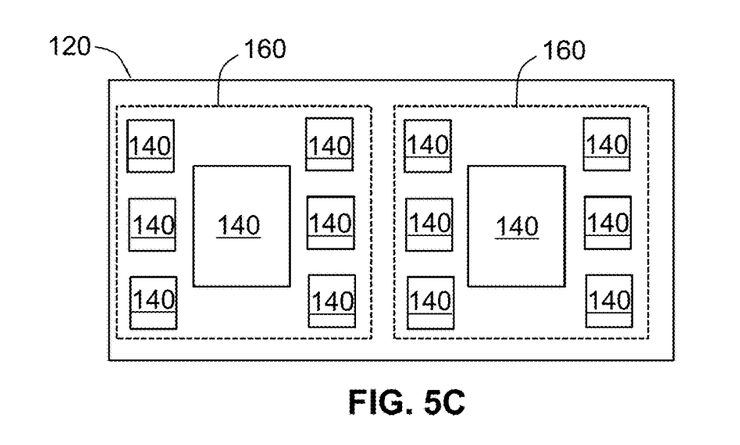

FIGS. 5A through 5C are top-down views of example exposure fields 120 showing different example configurations of modules 160 and the IC chips 140 therein. FIG. 5A shows an example exposure field 120 that encompasses four modules 160, with each module having one IC chip 140. FIG. 5B shows an example exposure field 120 that encompasses three modules 160, with each module 160 having three IC chips 140. FIG. 5C shows an example exposure field 120 that encompasses two modules 160, with each module 160 having seven IC chips 140.

As noted above, the IC chips 140 within a given exposure field 120 typically have position errors that cause upper surfaces 142 of IC chips 140 to be displaced (e.g., shifted and/or tilted) relative to the reference plane RP, which represents an ideal focus plane FP for the lithographic process. In the case where there are the aforementioned positional errors, focus plane FP may need to be shifted in each exposure field 120 so that photoresist layer 110 that covers upper surfaces 142 of IC chips 140 within the exposure field falls within the depth of focus of lithography tool 10.

For example, one exposure field 120 may have IC chips 140 with no significant out-of-plane errors, in which case the lithographic exposure can proceed with a normal exposure with focus plane FP that coincides with the middle of the photoresist layer 110. In another exposure field 120, upper surfaces 142 of IC chips 140 may reside in substantially different planes, e.g., at different heights. In this case, it would be best to calculate the best z-position for focus plane FP. For example, consider an exposure field 120 that has two IC chips 140 and photoresist layer 110 has a thickness of 10 microns. For the ideal case, upper surfaces 142 of IC chips 140 all reside in reference plane RP at z=0, so that photoresist layer 110 has a uniform thickness with its top surface 112 at z=10 microns. In this ideal situation, focus plane FP can be set at z=5 microns, i.e., in the middle of photoresist layer 110.

Now consider respective upper surfaces 142 of IC chips 140 residing at z=0 and at z=10 microns (as measured from reference plane RP) due to positional errors. In this case, there will be a corresponding topography variation in photoresist layer 110 requiring that best focus position of focus plane FP be set at an intermediate position, e.g., z=10 microns.

Another exposure field 120 may have some IC chips 140 that are tilted with respect to the reference plane RP while some IC chips 140 are not tilted but displaced in the z-direction. In this case, with sufficient information, the best location of the focus plane FP can be determined so that the yield for the lithography process is maximized.

Topography (Height) Measurements

An aspect of the methods disclosed herein includes measuring the topography of IC chips 140 supported by reconstituted wafer 100. This measurement needs to be performed as rapidly as possible to maintain the highest throughput when processing reconstituted wafers 100 through lithography tool 10.

Figure 6A:
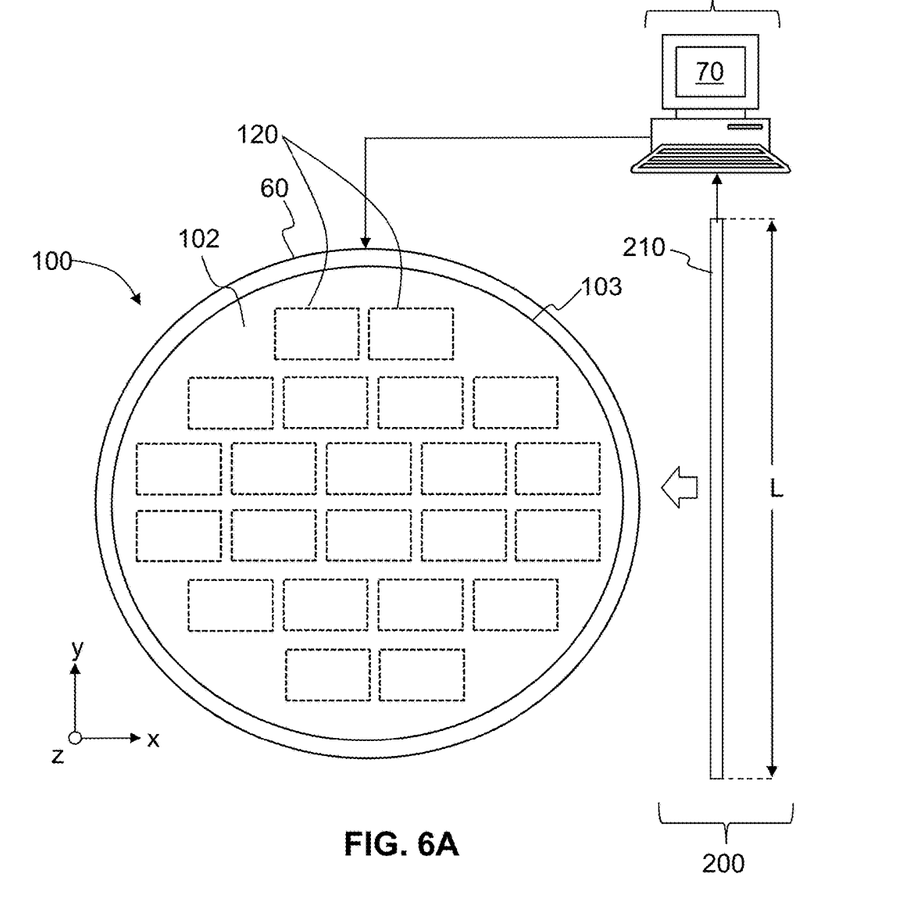
FIG. 6A is similar to FIG. 2 and illustrates an embodiment of a line-scanning height measurement system used to perform the methods disclosed herein.
Figure 6B:
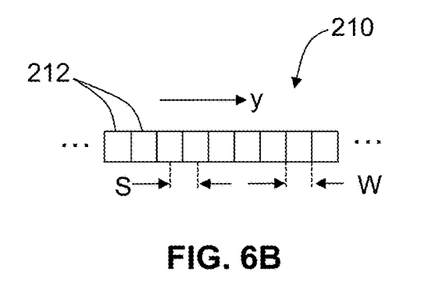
FIGS. 6B and 6C are close-up views of the line scanner showing different configurations of the sensor elements that make up the line scanner.

FIG. 6A is similar to FIG. 2 and illustrates an embodiment of a line-scanning height measurement system ("system") 200. System 200 includes a line scanner 210 of length L in the y-direction. As best seen in the close-up views of FIGS. 6B and 6C, the line scanner 210 has a plurality of height sensor elements ("height sensors") 212 that each senses a height at a position on reconstituted wafer 100. Adjacent height sensors 212 have a center-to-center spacing ("sensor spacing") S and a width W. In the example shown in FIG. 6C, sensor spacing S is the same as the width W, i.e., adjacent height sensors 212 are contact with one another so that there is no space between adjacent height sensors 212. In the example shown in FIG. 6B, adjacent height sensors 212 have some space s between them, i.e., S>W. Line scanner 210 is electrically connected to controller 70 of lithography tool 10. Reconstituted wafer 100 in FIG. 6A is shown supported on wafer stage 60 of lithography tool 10.

In an example, length L of line scanner 210 is at least the same as or greater than diameter WD of reconstituted wafer 100 so that the height measurement can be performed in a single scan of the reconstituted wafer. In an example, sensor spacing S is between 3 mm and 30 mm for a reconstituted wafer 100 having a diameter WD of 300 mm. This translates into between 10 and 100 height sensors 212 in line scanner 210. Example height sensors 212 are non-contact and further in an example are laser based. Laser-based height sensors are commercially available from Keyence Corporation of America, Itasca, Ill.

Figure 7:
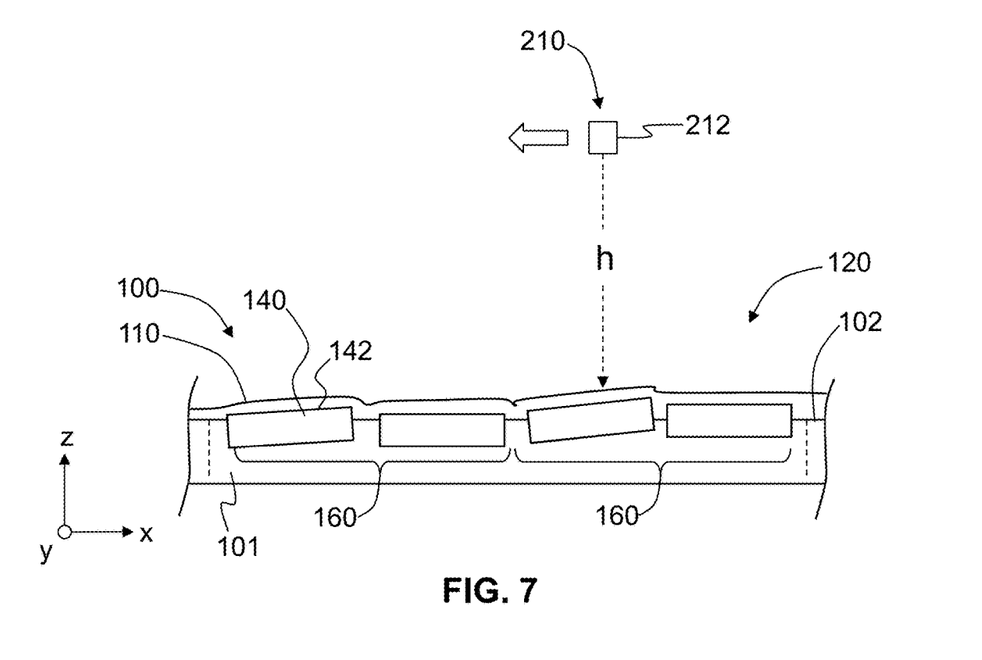
FIG. 7 is a close-up cross-sectional view of a portion of the reconstituted wafer similar to that shown in FIG. 3C and that shows the line scanner making a height measurement as the line scanner scans relative to the reconstituted wafer.

FIG. 7 is similar to FIG. 3C and illustrates an example height sensor 212 measuring a distance or height h from height sensor 212 to a location on reconstituted wafer 100. As line scanner 210 is scanned over reconstituted wafer 100 in the −x direction as shown in FIG. 6A, height sensors 212 collect height information along a corresponding y coordinate. Thus, at least some of height sensors 212 pass over IC chips 140, as shown in FIG. 7. In an example, photoresist layer 110 is present so that the surface topography is defined by the top surface 112 of the photoresist layer, which generally conforms to IC chips 140. Said differently, the position and orientation (e.g., angular rotation(s)) of IC chips 140 that underlie photoresist layer 110 define the topography of photoresist layer 110 so that the measured topography is substantially the same as the topography of IC chips 140. Thus, the surface topography of reconstituted wafer 100 is represented by h(x,y) for height measurements taken at discrete (x,y) positions on the reconstituted wafer.

It is desirable to have each height sensor 212 operate sufficiently fast to capture height data as line scanner 210 moves in the scanning direction, which is shown in FIG. 6A as the −x direction. In an example, line scanner 210 moves relative to reconstituted wafer 100 at a speed of about 300 mm/second. This can be accomplished by moving movable wafer stage 60. In another example, this can be accomplished by moving line scanner 210 over a stationary reconstituted wafer 100. In yet another example, both line scanner 210 and reconstituted wafer 100 move in opposite directions. In yet another example, line scanner 210 is disposed radially from the center of reconstituted wafer 100 and the reconstituted wafer is rotated beneath the line scanner.

For a scanning speed of about 300 mm/second, an example measurement frequency for height sensors 212 can be between 100 Hz and 10 KHz. At 100 Hz, a measurement in the wafer-scan direction is made every 3 mm. At 10 KHz, a measurement is made every 30 microns. The spatial resolution in the y-direction depends on the number of height sensors 212 and their sensor spacing S. For a spatial resolution in the y-direction of 1 mm for a 300 mm wafer, then 300 height sensors 212 are used in line scanner 210. Note that for a reconstituted wafer 100 having a diameter WD of 300 mm and a scanning speed of about 300 mm/second, the height (topography) measurement can be accomplished in about 1 second.

Figure 8:
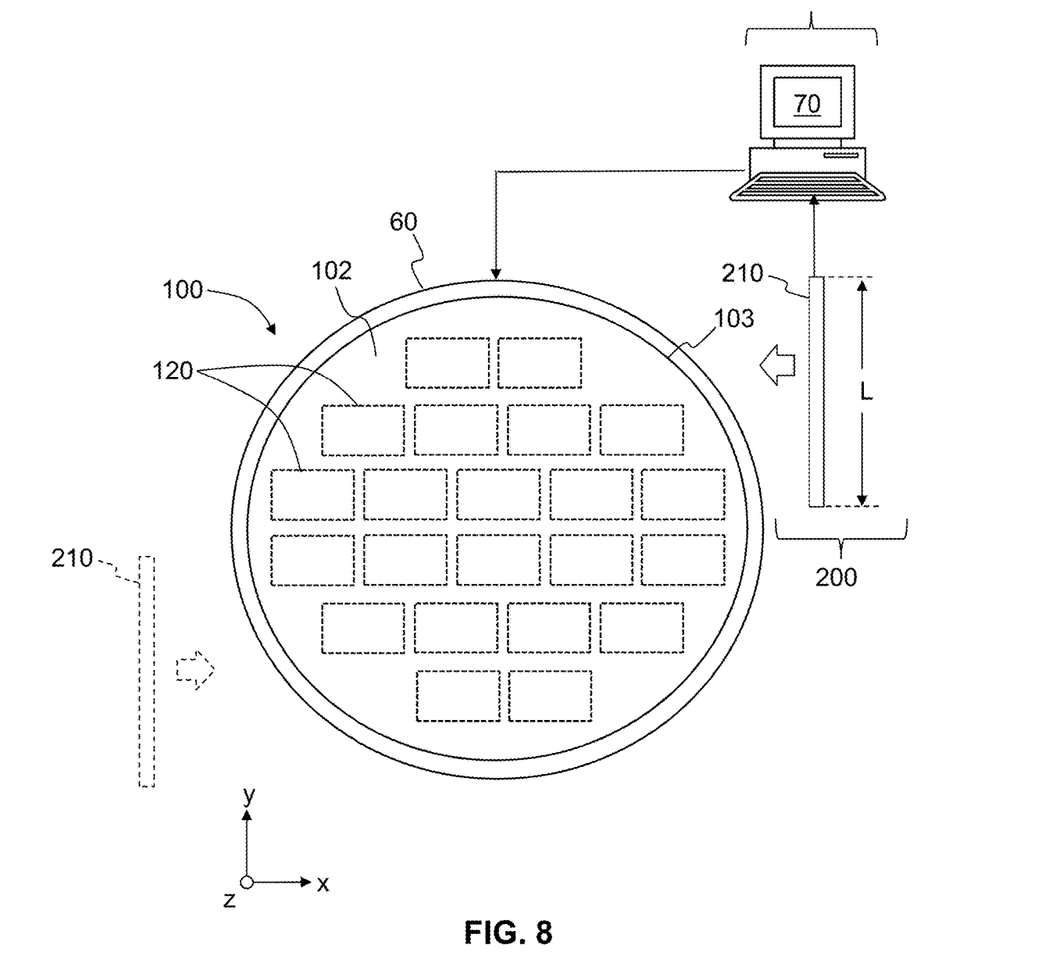
FIG. 8 is similar to FIG. 6A and shows an embodiment of the line-scanning height measurement system wherein the line scanner has a length less than that of the wafer diameter and that makes multiple passes over the reconstituted wafer to measure the topography of the reconstituted wafer.

FIG. 8 is similar to FIG. 6A and shows an example embodiment wherein line scanner 210 has a length L that is smaller than diameter WD of constituted wafer 100 so that at least two scans over the reconstituted wafer are required to measure the topography of the entire reconstituted wafer. In an example, length L is about WD/2 and further in an example is slightly larger than WD/2 to ensure some overlap in the scans. For example, for reconstituted wafer 100 with a diameter WD of 300 mm, line scanner 210 needs to have a length of only L=150 mm or slightly larger to ensure proper overlapping of the scans. On the first scan in the −x direction, half of reconstituted wafer 100 would be covered, and on the second scan in the opposite (+x direction), the other half of the reconstituted wafer would be covered.

Length L of line scanner 210 can be substantially an integer fraction WD/n of diameter WD of reconstituted wafer 100, i.e., WD/2, WD/3, WD/4, etc. with a corresponding number n of scans being required. While a smaller line scanner 210 reduces equipment cost, each additional scan adds time to the height measurement process, which reduces measurement throughput. On the other hand, multiple scans of line scanner 210 can still be performed within a few seconds and the topography generated almost instantaneously thereafter, so that a delay in throughput of say 4 seconds per reconstituted wafer 100 may not be considered substantial when the potential gains in the yield of the packing process is considered.

If sensor spacing S is fixed, then line scanner 210 must be selected to have the highest desirable resolution for any reconstituted wafer 100 that might be measured. If it is desirable to have a high spatial resolution in the sensor direction for one type of reconstituted wafer 10, then the same resolution will be obtained for all reconstituted wafers 100 even if some require lower resolution because they are used to form different devices.

Figure 6C:
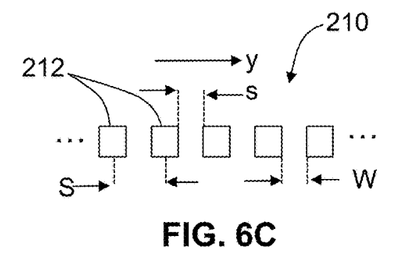
Figure 9:
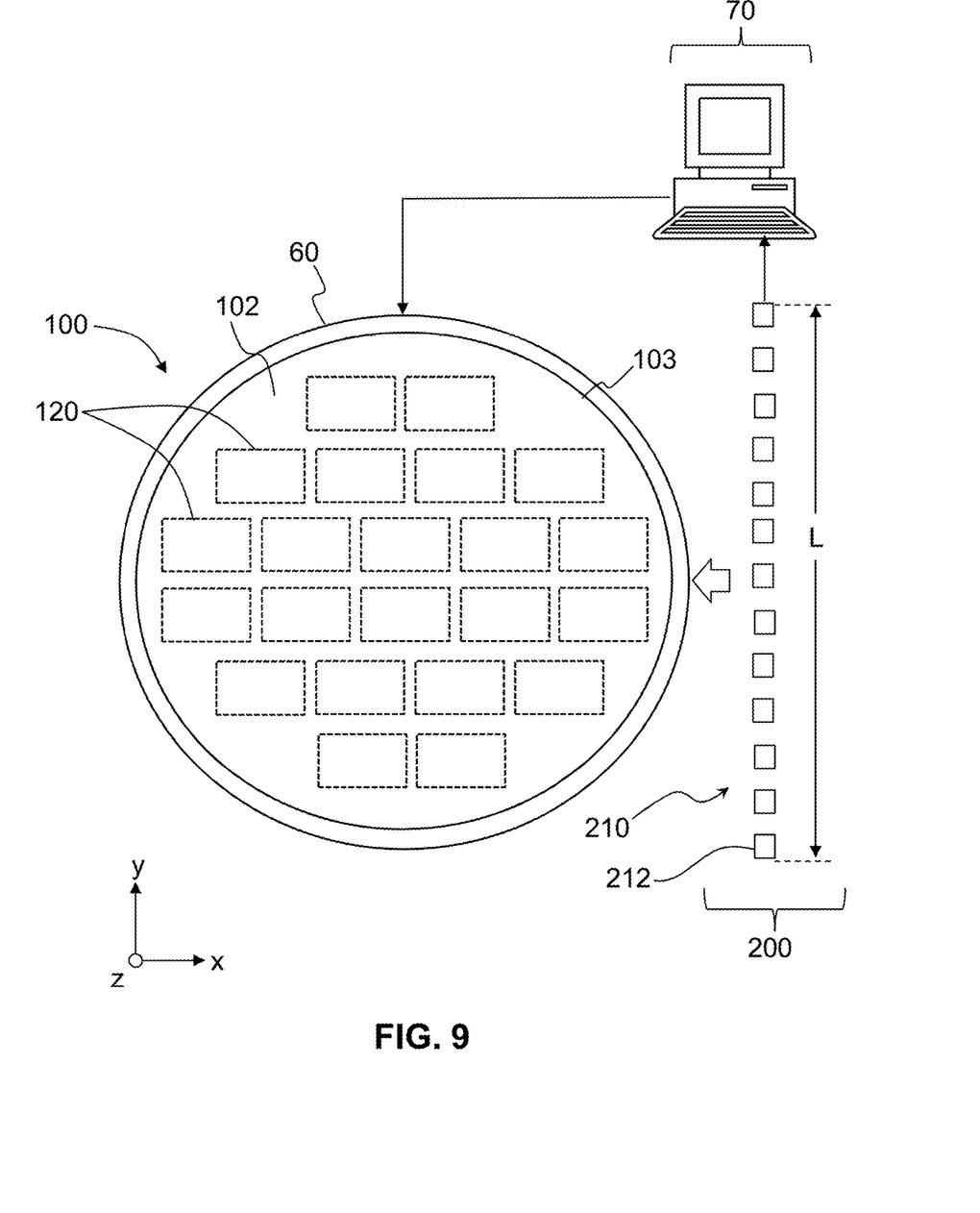
FIG. 9 is similar to FIG. 8 and shows an embodiment of the line scanner wherein the line sensor elements are spaced apart, as shown in the close-up view of FIG. 6C.

FIG. 9 is similar to FIG. 6A and shows an example embodiment where height sensors 212 of line scanner 210 are arranged in a distributed configuration, i.e., wherein there is some space between adjacent height sensors 212 (see also FIG. 6C). While this initially reduces the spatial resolution in the sensor direction for a single scan, the resolution can be rapidly improved by making multiple scans while shifting line scanner 210 in the y-direction. In an example, sensor spacing S is made adjustable so that height sensors 212 of line scanner 210 can be optimally configured for a given reconstituted wafer 100.

Figure 10A:
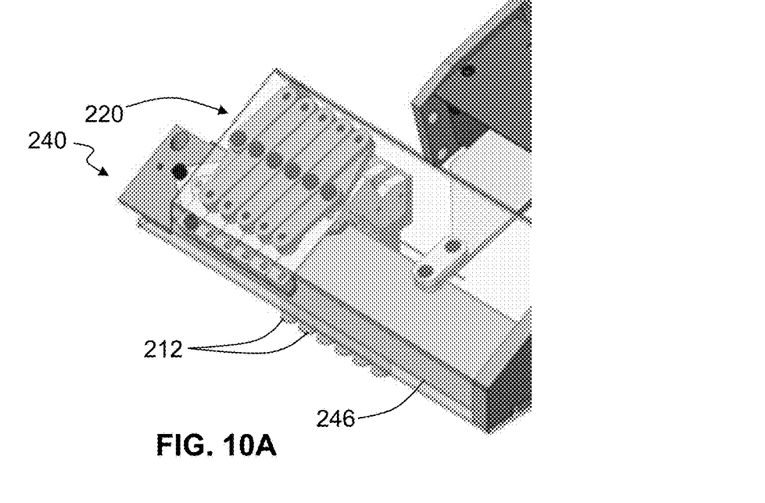
FIGS. 10A and 10B are top elevated views of an example line scanner configured to allow for an adjustable spacing between the height sensors.
Figure 10B:
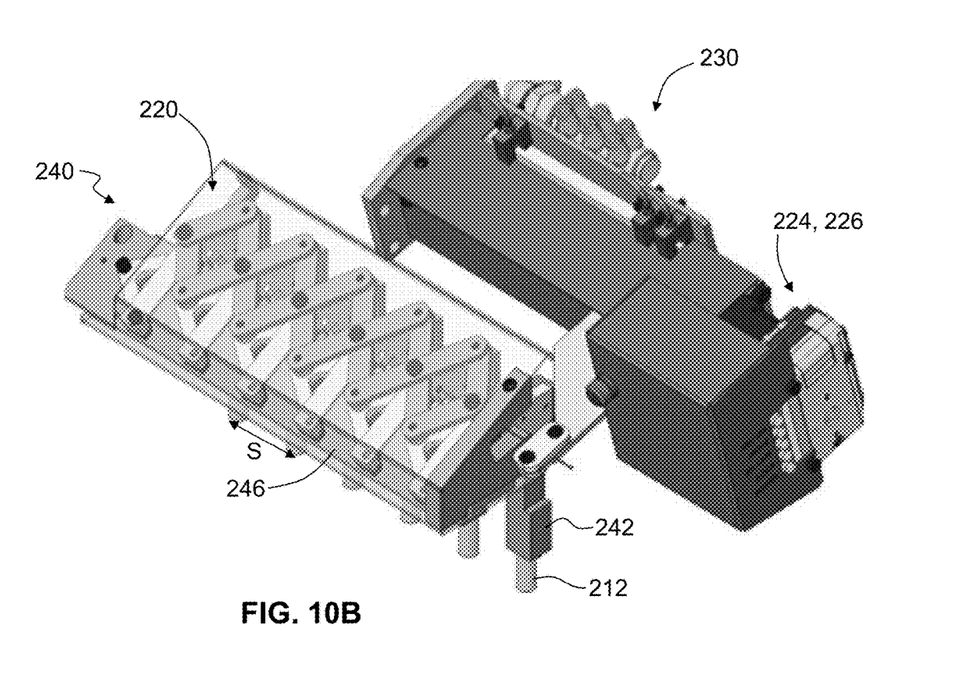

FIGS. 10A and 10B are top elevated views of an example line scanner 210 configured to allow for an adjustable sensor spacing S between height sensors 212. Height sensors 212 are mechanically connected by a linkage device 220 that is mechanically connected to a lead screw actuator 224 having a motor controller 226 and an encoder unit 230. Height sensors 212 are supported by a support assembly 240 that includes support members 242 that support height sensors 212 and that slide along a precision rail 246. Linkage device 220 is configured to be driven by lead screw actuator 224 such that height sensors 212 have an equal sensor spacing S. In an example, sensor spacing S can range from 10 mm to 34 mm. In an example, the height resolution is 10 nm, the measurement range is 1 mm, the working distance (distance from height sensor 212 to measurement surface) is 12 mm, the measurement spot size is 40 microns and the sampling rate is 5 kHz.

In an example, the measurement signal from each height sensor 212 includes a first reflection from the uppermost surface (e.g., top surface 112 of photoresist layer 110), a second reflection from the next underlying surface (e.g., upper surface 142 of IC chip 140 or upper surface 102 of reconstituted wafer 100), and a multiple reflection from within the photoresist layer 110. The height measurement can thus be based on any one of the measured surfaces.

Figure 11:
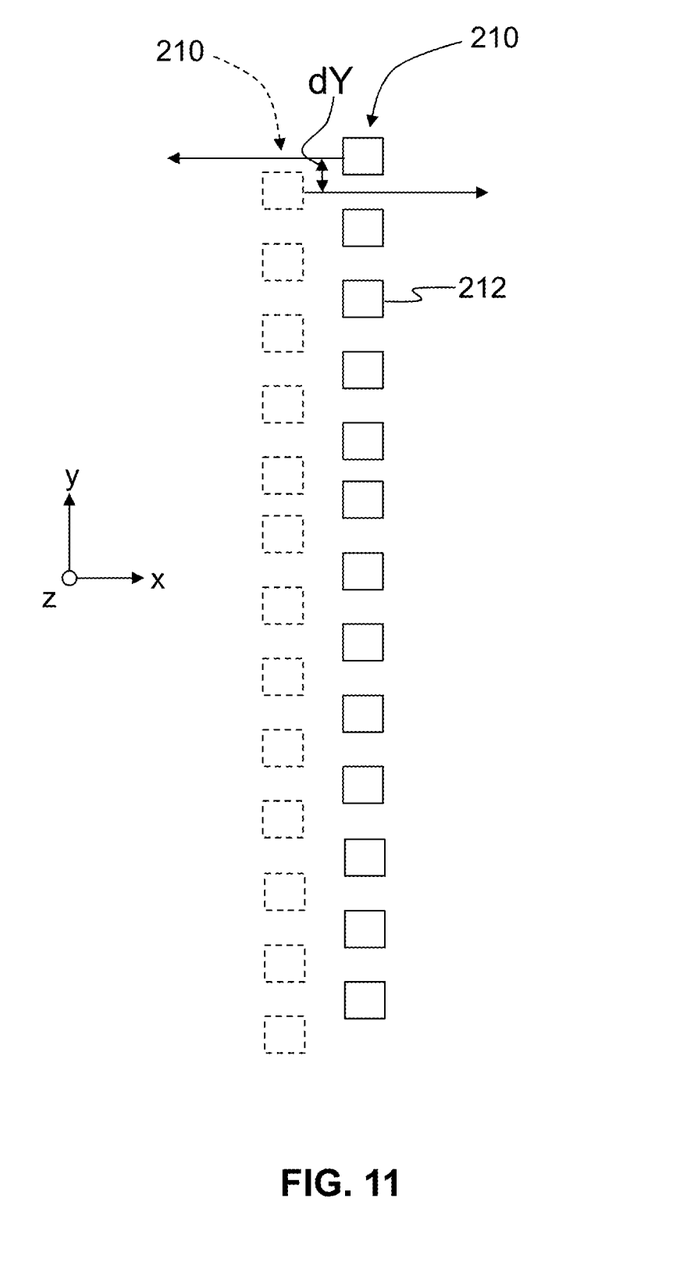
FIG. 11 is a close-up top-down view of the line scanner of FIG. 8 and illustrating how the line scanner can be shifted along the long direction by an amount dY when performing a second scan of the reconstituted wafer to improve the resolution of the topography measurement.

This distributed configuration of height sensors 212 for line scanner 210 reduces the cost of system 200 without a corresponding loss of spatial resolution. Thus, in an example, sensor spacing S can be as large as 30 mm. For some reconstituted wafers 100, this sensor spacing S may be sufficient for a height measurement performed using just a single scan. However, for reconstituted wafers 100 that require a greater spatial resolution, line scanner 210 can be scanned over upper surface 102 of reconstituted wafer 100, then shifted by amount dY in the y-direction relative to reconstituted wafer 100, and the scanned again, as illustrated in FIG. 11.

This process of shifting and scanning can be repeated multiple times. Thus, by way of example, for height sensors 212 that have a sensor spacing of S=30 mm, a shift of dY=15 mm can be made for the second scan. The effect will be a spatial resolution of 15 mm in the line-scan direction. This offers the flexibility of obtaining variable spatial resolution (as needed) at a trade-off to the number of scans and scan time (hence throughput). By having height sensors 212 adjustable at an equal sensor spacing S, the measurement throughput can optimized by setting the sensor spacing S at an integer fraction of the field pitch pF, namely S=pF/n, wherein the field pitch pF is the field center-to-center spacing in the cross-scan direction (e.g., the y-direction, as shown in FIG. 2) and n is an integer. Thus, with either a rectilinear or a bricked stepping pattern, the identical locations within all exposure fields 120 can be measured with the fewest scans.

Once the topography measurements are made, the profile of reconstituted wafer 100 (in both the x and y directions) is computed. In the y-direction, a small number of measurements may be made (e.g., a minimum of 2 or 3 measurements per exposure field 120) whereas in the x-direction (where the exposure field 120 may be 60 mm in size), there can be 3 to 1000 measurements. In an example, at least 100 height measurements are made (minimum of 4 per exposure field 120). The maximum number of measurements in the x-direction is limited by the measurement frequency, scan speed and processing time.

With all these measurements, the best fit focus plane FP for the given exposure field 120 is determined. Controller 70 then sets the lithography tool 10 accordingly, by a z-direction and theta-x, theta-y adjustment of wafer stage 60. In an example, the focus plane FP is set based on a least-squares calculation that minimizes the distance between the focus plane FP and the measured variations in the surface topography.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of processing a reconstituted wafer that supports integrated circuit (IC) chips each having an upper surface coated with a photoresist layer, comprising:

a) operably disposing the reconstituted wafer in a lithography tool that has a depth of focus and a focus plane and that defines exposure fields on the reconstituted wafer, wherein each exposure field includes at least one of the IC chips;

b) performing at least one scan of the reconstituted wafer with a line scanner that comprises a plurality of height sensor elements arranged along a long direction to measure a surface topography of the reconstituted wafer, wherein the surface topography is defined by the plurality of IC chips;

c) for a given exposure field:
  i) adjusting at least one of a position and an orientation of the reconstituted wafer relative to the focus plane of the lithography tool so that the photoresist layers of the IC chips within the given exposure field fall within the depth of focus; and
  ii) performing an exposure with the lithography tool to pattern the photoresist layers of the IC chips in the given exposure field; and d) repeating act c) for each of the exposure fields.

2. The method according to claim 1, further comprising after act d):

e) processing the patterned photoresist layers of the IC chips to form respective conductive structures on the upper surfaces of the IC chips.

3. The method according to claim 1, wherein the height sensor elements each have a width W and a center-to-center spacing of S, wherein S>W, and further comprising:
  in act b), performing a first scan of the upper surface of reconstituted wafer, then defining a shifted position of the line scanner by shifting the line scanner in the long direction relative to the reconstituted wafer by an amount equal to or greater than the width W of the height sensor elements, and then performing a second scan of the upper surface of the reconstituted wafer with the line scanner in the shifted position.

4. The method according to claim 1, wherein the act b) of performing at least one scan of the reconstituted wafer includes moving the line scanner or the reconstituted wafer.

5. The method according to claim 1, wherein the act b) of performing at least one scan of the reconstituted wafer includes moving both the line scanner and the reconstituted wafer.

6. The method according to claim 2, further comprising processing the patterned photoresist layers to form respective redistribution layers that each includes conductive features.

7. The method according to claim 1, wherein the height sensor elements each have a width and a center-to-center spacing, and further comprising:
  performing a first scan with a first center-to-center spacing;
  changing the center-to-center spacing to define a second center-to-center spacing; and
  performing a second scan with the second center-to-center spacing.

8. The method according to claim 7, wherein the height sensor elements are mechanically connected to a mechanical linkage, and wherein changing the center-to-center spacing includes activating the mechanical linkage.

9. The method according to claim 1, wherein the exposure fields have a field pitch in a cross-scan direction, the height sensor elements each have a width W and a center-to-center sensor spacing of S, wherein S>W, and wherein S is an integer fraction of the field pitch pF.

10. The method according to claim 1, wherein act b) includes making at least 3 and no greater than 1000 height measurements per exposure field.

* * * * *